United States Patent
Haddad et al.

[11] Patent Number: 5,901,090
[45] Date of Patent: May 4, 1999

[54] METHOD FOR ERASING FLASH ELECTRICALLY ERASABLE PROGRAMMABLE READ-ONLY MEMORY (EEPROM)

[75] Inventors: Sameer S. Haddad, San Jose; Wing H. Leung; John Chen, both of Cupertino; Ravi S. Sunkavalli, Santa Clara; Ravi P. Gutala, Milpitas, all of Calif.; Jonathan S. Su, Evanston, Ill.; Colin S. Bill, Cupertino; Vei-Han Chen, San Jose, both of Calif.

[73] Assignee: Advanced Micro Devices, Sunnyvale, Calif.

[21] Appl. No.: 09/085,552

[22] Filed: May 27, 1998

[51] Int. Cl.⁶ .................................................. G11C 16/04
[52] U.S. Cl. ................................... 365/185.29; 365/185.3
[58] Field of Search ........................... 365/185.29, 185.3, 365/185.33, 185.11, 185.12

[56] References Cited

U.S. PATENT DOCUMENTS

| | | | |
|---|---|---|---|
| 5,237,535 | 8/1993 | Mielke | 365/218 |
| 5,508,959 | 4/1996 | Lee | 365/185.3 |
| 5,546,340 | 8/1996 | Hu | 365/185.3 |
| 5,642,311 | 6/1997 | Cleveland et al. | 365/185.3 |
| 5,844,847 | 12/1998 | Kobatake | 365/185.29 |

*Primary Examiner*—Son Mai
*Attorney, Agent, or Firm*—David G. Alexander

[57] ABSTRACT

A flash Electrically-Erasable Programmable Read-Only Memory (EEPROM) includes a plurality of field effect transistor memory cells each having a source, drain, floating gate and control gate, and a power source for supplying a plurality of voltages to the cells. A controller controls the power source to apply at least one erase pulse to the cells. Then, at least one overerase correction or "soft programming" pulse is applied to the cells during which the source, drain and control gate voltages of the cells are such that the threshold voltages of overerased cells will be increased, but least erased cells will not be disturbed. The overerase correction pulses thereby tighten the threshold voltage distribution. A source to substrate bias voltage is applied for the duration of the overerase correction pulses which reduces the background leakage of the cells to a level at which the overerase correction operation can be effectively performed, even in applications with low supply voltages.

22 Claims, 7 Drawing Sheets

METHOD FOR ERASING FLASH ELECTRICALLY ERASABLE PROGRAMMABLE READ-ONLY MEMORY (EEPROM)

BACKGROUND OF THE INVENTION

1. Field of the Invention

The present invention generally relates to the art of microelectronic integrated circuits, and more specifically to a method for erasing a flash Electrically Erasable Programmable Read-Only Memory (EEPROM).

2. Description of the Related Art

A microelectronic flash or block erase Electrically Erasable Programmable Read-Only Memory (Flash EEPROM) includes an array of cells which can be independently programmed and read. The size of each cell and thereby the memory are made small by omitting select transistors which would enable the cells to be erased independently. All of the cells are erased together as a block.

A memory of this type includes individual Metal-Oxide-Semiconductor (MOS) field effect transistor memory cells, each of which includes a source, drain, floating gate and control gate to which various voltages are applied to program the cell with a binary 1 or 0, or erase all of the cells as a block.

The cells are connected in a rectangular array of rows and columns, with the control gates of the cells in a row being connected to a respective wordline and the drains of the cells in a column being connected to a respective bitline. The sources of the cells are connected together. This arrangement is known as a NOR memory configuration.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate, 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of −10 V to the control gate, applying 5 V to the source and allowing the drain to float.

A problem with the conventional flash EEPROM cell arrangement is that due to manufacturing tolerances, some cells become over-erased before other cells become erased sufficiently. The floating gates of the over-erased cells are depleted of electrons and become positively charged. This causes the over-erased cells to function as depletion mode transistors which cannot be turned off by normal operating voltages applied to their control gates, and introduces leakage during subsequent program and read operations.

More specifically, during program and read operations only one wordline which is connected to the control gates of a row of cells is held high at a time, while the other wordlines are grounded. However, a positive voltage is applied to the drains of all of the cells. If the threshold voltage of an unselected cell is zero or negative, leakage current will flow through the source, channel and drain of the cell.

This undesirable effect is illustrated in FIG. 1. The drains of a column of floating gate cell transistors $T_0$ to $T_m$ are connected to a bitline BL, which is iteslf connected to a bitline driver 1. The sources of the transistors $T_0$ to $T_m$ are typically connected to ground. One of the transistors $T_0$ to $T_m$ is selected for a program or read operation by applying a positive voltage, e.g. 5 V, to its control gate which turns on the transistor. The control gates of the unselected tranistors are connected to ground.

As viewed in FIG. 1, 5 V is applied to the transistor $T_1$ which turns it on. A curent $I_1$ flows through the transistor $T_1$ from ground through its source, channel (not shown) and drain and through the bitline BL to the driver 1. Ideally, the bitline current $I_{BL}$ should be equal to $I_1$.

However, if one or more of the unselected transistors, e.g. the transistor $T_2$ as illustrated in FIG. 1, is overerased, its threshold voltage will be zero or negative, and background leakage current will flow through the transistor $T_2$ as indicated at $I_2$. The bitline current $I_{BL}$ is now no longer equal to $I_1$, but is equal to the sum of $I_1$ and the background leakage current $I_2$.

In a typical flash EEPROM, the drains of a large number, for example 512, transistor cells such as illustrated in FIG. 1 are connected to each bitline (column). If a substantial number of cells on the bitline are drawing background leakage current, the total leakage current on the bitline can exceed the cell read current. This makes it impossible to read the state of a cell on the bitline and renders the memory inoperative.

FIG. 2 illustrates how the threshold voltages of the cells or bits in a flash EEPROM can differ substantially from each other following an erase operation as shown by a solid line curve which represents the numbers of cells having particular values of threshold voltage $V_T$. It will be seen that the least erased cells will have a relatively high threshold voltage $V_T$MAX, whereas the most overerased cells will have a low threshold voltage which is below a minimum acceptable value $V_T$MIN that can be negative. The characteristic illustrated in FIG. 2 is known as the threshold voltage distribution.

FIG. 3 illustrates how the background leakage current of a cell varies as a function of threshold voltage. The lower (more negative) the threshold voltage, the higher the leakage current. It is therefore desirable to prevent cells from being overerased and reduce the threshold voltage distribution to as low a range as possible, with ideally all cells having the same high threshold voltage after erase on the order of 2 V.

It is known in the art to reduce the threshold voltage distribution by performing an overerase correction operation which reprograms the most overerased cells to a higher threshold voltage. This operation will result in the threshold voltage curve being altered to the shape indicated by broken line in FIG. 2 in which the threshold voltages of all of the cells are above the minimum acceptable value $V_T$MIN. An overerase correction operation of this type is generally known as Automatic Programming Disturb (APD).

A preferred APD method which is referred to as Automatic Programming Disturb Erase (APDE) is disclosed in U.S. Pat. No. 5,642,311, entitled "OVERERASE CORRECTION FOR FLASH MEMORY WHICH LIMITS OVERERASE AND PREVENTS ERASE VERIFY ERRORS", issued Jun. 24, 1997 to Lee Cleveland. This patent is assigned to the same assignee as the present invention and is incorporated herein by reference in its entirety. The method includes sensing for overerased cells and applying programming pulses thereto which bring their threshold voltages back up to acceptable values.

Following application of an erase pulse, undererase correction is first performed on a cell-by cell basis by rows. The cell in the first row and column position is addressed and erase verified by applying 4 V to the control gate (wordline), 1 V to the drain (bitline), grounding the source, and using sense amplifiers to sense the bitline current and thereby determine if the threshold voltage of the cell is above a value of, for example, 2 V. If the cell is undererased (threshold voltage above 2 V), the bitline current will be low. In this case, an erase pulse is applied to all of the cells, and the first cell is erase verified again.

After application of each erase pulse and prior to a subsequent erase verify operation, overerase correction is performed on all of the cells of the memory. Overerase verify is performed on the bitlines of the array in sequence. This is accomplished by grounding the wordlines, applying typically 1 V to address the first bitline, and sensing the bitline current. If the current is above a predetermined value, this indicates that at least one of the cells connected to the bitline is overerased and is drawing leakage current. In this case, an overerase correction pulse is applied to the bitline. This is accomplished by applying approximately 5 V to the bitline for a predetermined length of time such as 100 $\mu$s.

After application of the overerase correction pulse the bitline is verified again. If bitline current is still high indicating that an overerased cell still remains connected to the bitline, another overerase correction pulse is applied. This procedure is repeated for all of the bitlines in sequence.

The procedure is repeated as many times as necessary until the bitline current is reduced to the predetermined value which is lower than the read current. Then, the procedure is performed for the rest of the cells in the first row and following rows until all of the cells in the memory have been erase verified.

By performing the overerase correction procedure after each erase pulse, the extent to which cells are overerased is reduced, improving the endurance of cells. Further, because overerased cells are corrected after each erase pulse, bitline leakage current is reduced during erase verify, thus preventing undererased cells from existing upon completion of the erase verify procedure.

Although the APDE method is effective in eliminating overerased cells, it is limited in that since the sources and wordlines (control gates) of the cells are grounded during overerase correction, overerased cells will draw background leakage current while the overerase correction pulses are being applied. The leakage current requires the provision of a large power supply.

Even if the process parameters are controlled such that overerase correction pulses will not create undererased cells, the amount by which the threshold voltage distribution can be reduced is inherently limited because there is no mechanism for preventing the threshold voltages of properly erased cells from being further increased by overerase correction pulses applied thereto. In addition, background leakage current is also present during programming and creates similar problems.

These problems are exacerbated as the supply voltage $V_{cc}$ is reduced in step with the reduction of feature sizes of EEPROMs. The threshold voltages of the erased cells must be reduced to accommodate the lower values of $V_{cc}$. This results in more cells in the low threshold voltage portion of the curve in FIG. 2 drawing leakage current.

In a sufficiently low $V_{cc}$ application, so many cells will draw leakage current that the total bitline leakage current during erase verify can exceed the value corresponding to an erased cell, even if the cell being verified is undererased. This makes it impossible to determine the state of a cell during erase verify and read, and renders the memory inoperative. This problem has remained unsolved in the prior art and has severely hindered the development of reduced voltage EEPROMs.

Another undesirable effect which becomes especially problematic at low values of $V_{cc}$ is that if $V_{cc}$ is applied directly to a wordline, it will be insufficient to enhance the channel of a selected cell such that a verify operation can be performed during erase. For this reason, a booster is provided to boost the wordline voltage to a value which is sufficiently higher than $V_{cc}$ that cell verification can be reliably performed. For a value of $V_{cc}$=3 V, the wordline voltage is typically boosted to a value of approximately 4–5 V.

Voltages are applied to bitlines through pass transistors which enable individual bitline selection. The background leakage current loads down the charge pump and increases the voltage drop across the pass transistors, resulting in a lower drain voltage being applied to the cells. If the drain voltage becomes too low, which can result from excessive leakage current, the cell operation can become unstable and unreliable.

SUMMARY OF THE INVENTION

It is an object of the present invention to provide a method for erasing a flash Electrically-Erasable Programmable Read-Only Memory (EEPROM) which overcomes the above described limitations of the prior art.

More specifically, a flash EEPROM embodying the present invention includes a plurality of field effect transistor memory cells each having a source, drain, floating gate and control gate, and a power source for supplying a plurality of voltages to the cells.

A controller controls the power source to apply at least one erase pulse to the cells. Then, at least one overerase correction or "soft programming" pulse is applied to the cells during which the source, drain and control gate voltages of the cells are such that the threshold voltages of overerased cells will be increased, but least erased cells will not be disturbed. The overerase correction pulses thereby tighten the threshold voltage distribution.

A source to substrate bias voltage is applied for the duration of the overerase correction pulses which reduces the background leakage of the cells to a level at which the overerase correction operation can be effectively performed, even in applications with low supply voltages.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 4:
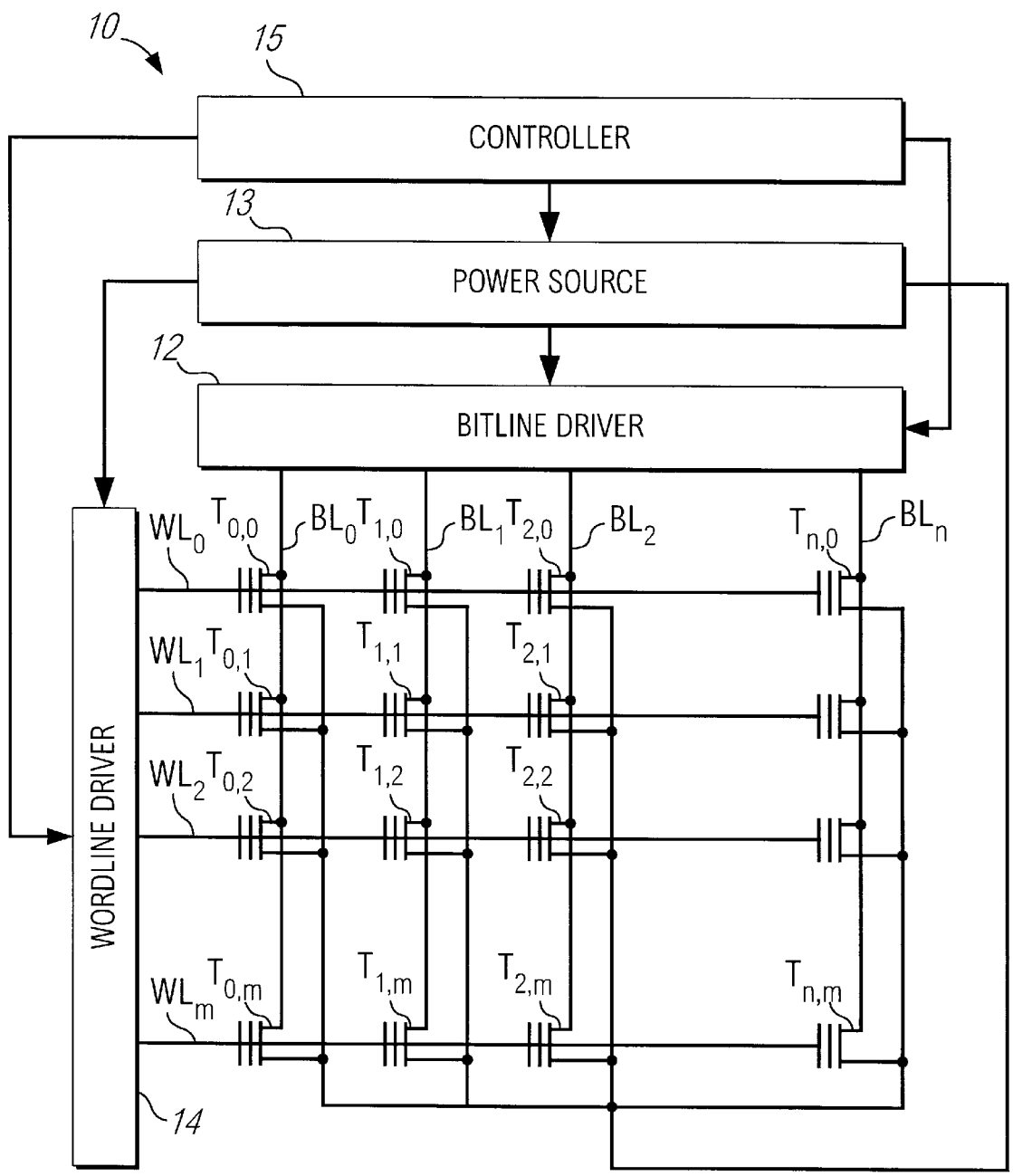
FIG. 4 is a simplified electrical schematic diagram of a flash EEPROM.

FIG. 4 illustrates the basic configuration of a NOR type flash Electrically Erasable Programmable Read-Only Memory (EEPROM) 10 to which the present invention is advantageously applied. The memory 10 comprises a plurality of core or memory cells which are arranged in a rectangular matrix or array of rows and columns. Each row is associated with a wordline, whereas each column is associated with a bitline.

Assuming that there are n columns and m rows, the bitlines are designated as $BL_0$ to $BL_n$ and the wordlines are designated as $WL_0$ to $WL_m$. Appropriate voltages are applied to the bitlines by a bitline driver 12, whereas appropriate voltages are applied to the wordlines by a wordline driver 14. The voltages applied to the drivers 12 and 14 are generated by a power source 13 under the control of a controller 15 which is typically on-chip logic circuitry. The controller 15 also controls the drivers 12 and 14 to address the memory cells individually or collectively as will be described below.

A memory cell is located at each junction of a wordline and a bitline. Each cell includes a Metal-Oxide-Semiconductor (MOS) Field-Effect Transistor (FET) having a source, drain, gate oxide and control gate. The cells of a flash EEPROM differ from conventional FETs in that they additionally include a floating gate and tunnel oxide layer disposed underneath the gate oxide and control gate.

The cells illustrated in FIG. 4 are designated using the notation $T_{n,m}$, where m is the row (wordline) number and n is the column (bitline) number. The control gates of the cells are connected to respective wordlines, and the drains of the cells are connected to respective bitlines as illustrated. The sources of all of the cells are connected to the power source 13.

A cell is programmed by applying, typically, 9 V to the control gate, 5 V to the drain and grounding the source, which causes hot electrons to be injected from the drain depletion region into the floating gate. Upon removal of the programming voltages, the injected electrons are trapped in the floating gate and create a negative charge therein which increases the threshold voltage of the cell to a value in excess of approximately 4 V.

The cell is read by applying typically 5 V to the control gate and 1 V to the bitline to which the drain is connected, grounding the source, and sensing the bitline current. If the cell is programmed and the threshold voltage is relatively high (4 V), the bitline current will be zero or at least relatively low. If the cell is not programmed or erased, the threshold voltage will be relatively low (2 V), the control gate voltage will enhance the channel, and the bitline current will be relatively high.

Reading, and verifying, as will be described below, are preferably performed using sense amplifiers and a reference current array as disclosed in the above referenced patent to Cleveland. The details of these elements are not the particular subject matter of the present invention.

A cell can be erased in several ways. In one arrangement, a cell is erased by applying typically 12 V to the source, grounding the control gate and allowing the drain to float. This causes the electrons which were injected into the floating gate during programming to be removed by Fowler-Nordheim tunneling from the floating gate through the thin tunnel oxide layer to the source. Alternatively, a cell can be erased by applying a negative voltage on the order of −10 V to the control gate, applying 5 V to the source and allowing the drain to float.

Figure 5:
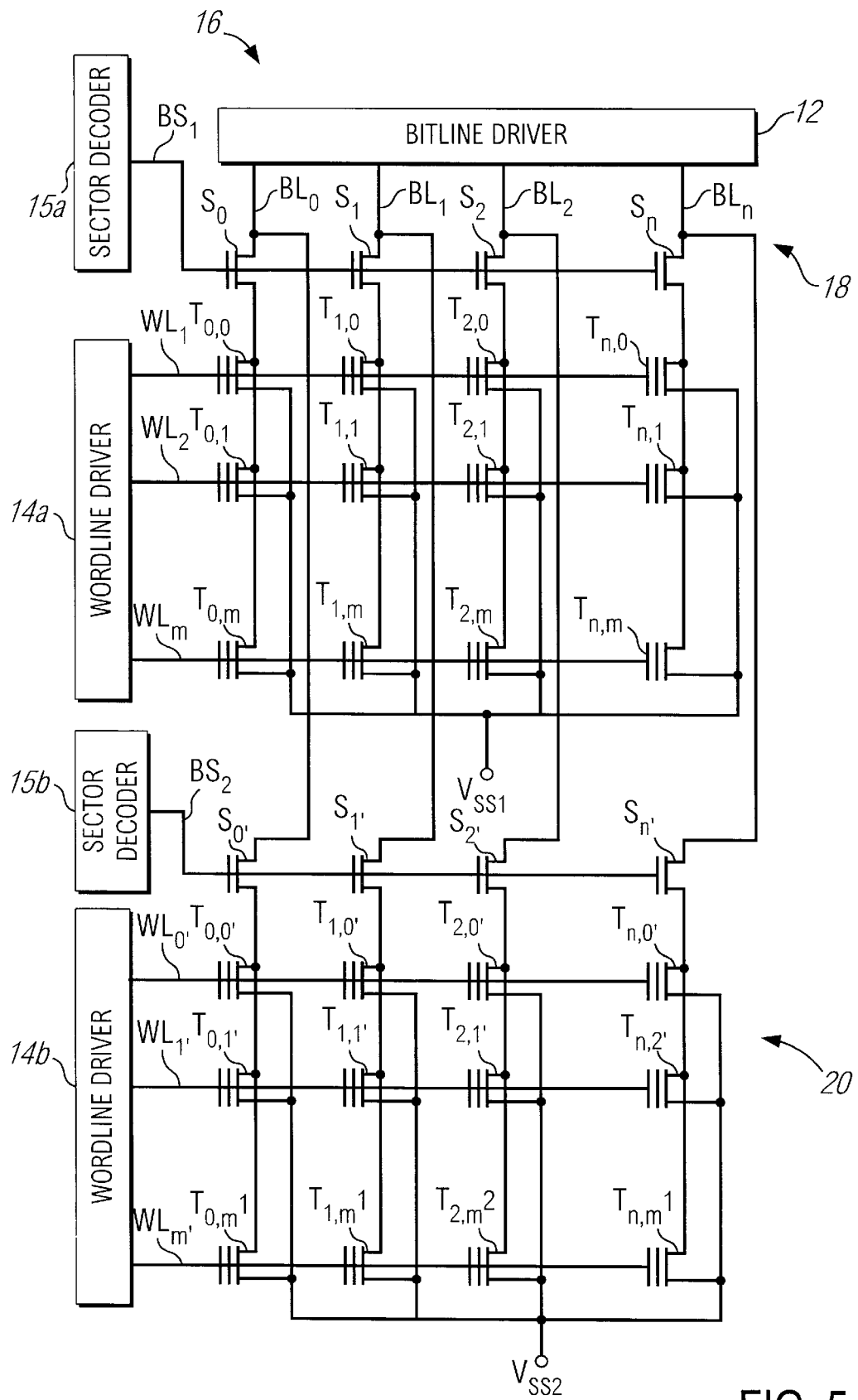
FIG. 5 is similar to FIG. 4 but illustrates a flash EEPROM having cells arranged in pages or banks.

FIG. 5 illustrates another flash EEPROM memory 16 which is similar to the memory 10 except that the cells are divided into a plurality, in the illustrated example two, of banks (also known as pages or sectors), each of which can be programmed, erased and read independently. The memory 16 includes a first cell bank 18 and a second cell bank 20. The memory cells in the first bank 18 are designated in the same manner as in FIG. 4, whereas a prime symbol is added to the designations of the cells in the second bank 20. The wordlines of the banks 18 and 20 are connected to separate wordline drivers 14a and 14b respectively.

In addition to the memory cells, each bank 18 and 20 includes a select transistor for each bitline. The select transistors for the banks 18 and 20 are designated as $S_0$ to $S_n$ and $S_0'$ to $S_n'$ respectively. The drains of the select transistors are connected to the respective bitlines, whereas the sources of the select transistors are connected to the drains of the transistors for the wordlines $WL_0$ to $WL_m$ and $WL_0'$ to $WL_m'$.

The select transistors differ from the memory cell transistors in that they are conventional MOSFETs and lack floating gates. The select transistors are switching elements rather than memory elements. The gates of the select transistors for the bank 18 are connected to a bank select output $BS_1$ of a sector decoder 15a, whereas the gates of the select transistors for the bank 20 are connected to a bank select output $BS_2$ of a sector decoder 15b.

The sources of the cells in bank 18 are connected to a common source supply voltage $V_{ss}1$, whereas the sources of the cells in the bank 20 are connected to a common source supply voltage $V_{ss}2$.

The bank 18 is selected by applying a logically high signal to the bank select line $BS_1$ which turns on the transistors $S_0$ to $S_n$ and connects the bitlines $BL_0$ to $BL_n$ to the underlying memory cells. The bank 18 is deselected by applying a logically low signal to the bank select line $BS_1$ which turns off the transistors $S_0$ to $S_n$ and disconnects the memory cells from the bitlines. The bank 20 is selected and deselected in an essentially similar manner using the bank select signal $BS_2$ and select transistors $S_0'$ to $S_n'$. The operation of the memory 16 is essentially similar to that of the memory 10, except that the program, erase and read operations are performed on the banks 18 and 20 sequentially and independently.

Figure 6:
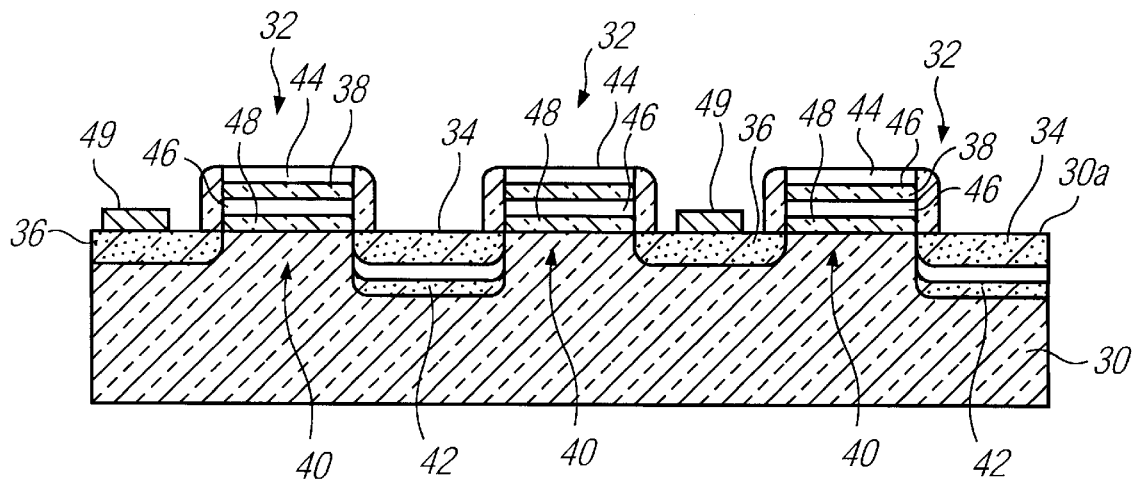
FIG. 6 is a simplified partial sectional view of a flash EEPROM illustrating the elements of the cells thereof.

FIG. 6 is a simplified sectional view illustrating the construction of the individual memory cells of the memory 10 or 16. The memory is formed on a silicon or other semiconductor substrate 30. Three erasable memory cells 32 are illustrated as being formed on a surface 30a of the substrate 30, each including a Metal-Oxide-Semiconductor (MOS) Field-Effect Transistor (FET) structure having a source 34, drain 36, an interdielectric layer 38, and channel 40 underlying a tunnel oxide layer 48. A polysilicon control gate 44 is formed over each gate oxide layer 38, and a polysilicon floating gate 46 and the tunnel oxide layer 48 are formed underneath the control gate 44 over the channel 40.

Each pair of cells 32 is arranged to share a common source 34 and drain 36. The sources 34 are connected to a common source line, whereas a bitline connection 49 is formed on each drain 36.

The method by which the present invention performs overerase correction and programming for a flash EEPROM and overcomes the problem of background leakage current as discussed above will now be described in detail. In the example presented in this disclosure the memory cells are assumed to be NMOS enhancement mode FETs. However, it will be understood that the invention is not so limited and that the scope thereof encompasses applying the principles described herein to other types and configurations including, for example, PMOS and/or depletion mode FETs in any combination.

The memory is erased by applying one or more erase pulses to all of the cells (or all of the cells in a bank or sector) of the memory. Then, undererase correction is performed on a column-by-column basis for each row. First, the cell in the first row and column position is addressed and erase verified by applying typically 4 V to the control gate (wordline), 1 V to the drain (bitline), grounding the source, and using sense amplifiers to sense the bitline current and thereby determine if the cell is undererased.

If the cell is undererased, the bitline current will be zero or at least relatively low. In this case, an erase pulse is applied to all of the cells, and the first cell is erase verified again.

This procedure is repeated as many times as necessary until the bitline current has been brought above a predetermined value corresponding to an erased cell. Then, the procedure is performed for the rest of the cells in the first row and following rows until all of the cells in the memory have been erase verified.

The present overerase correction procedure is preferably performed after the application of each erase pulse or pulse to the memory in accordance with the APDE method described above. However, it is further within the scope of the invention to perform the overerase correction procedure after all of the memory cells have been erased and erase verified in accordance with a prior art method.

Figure 1:
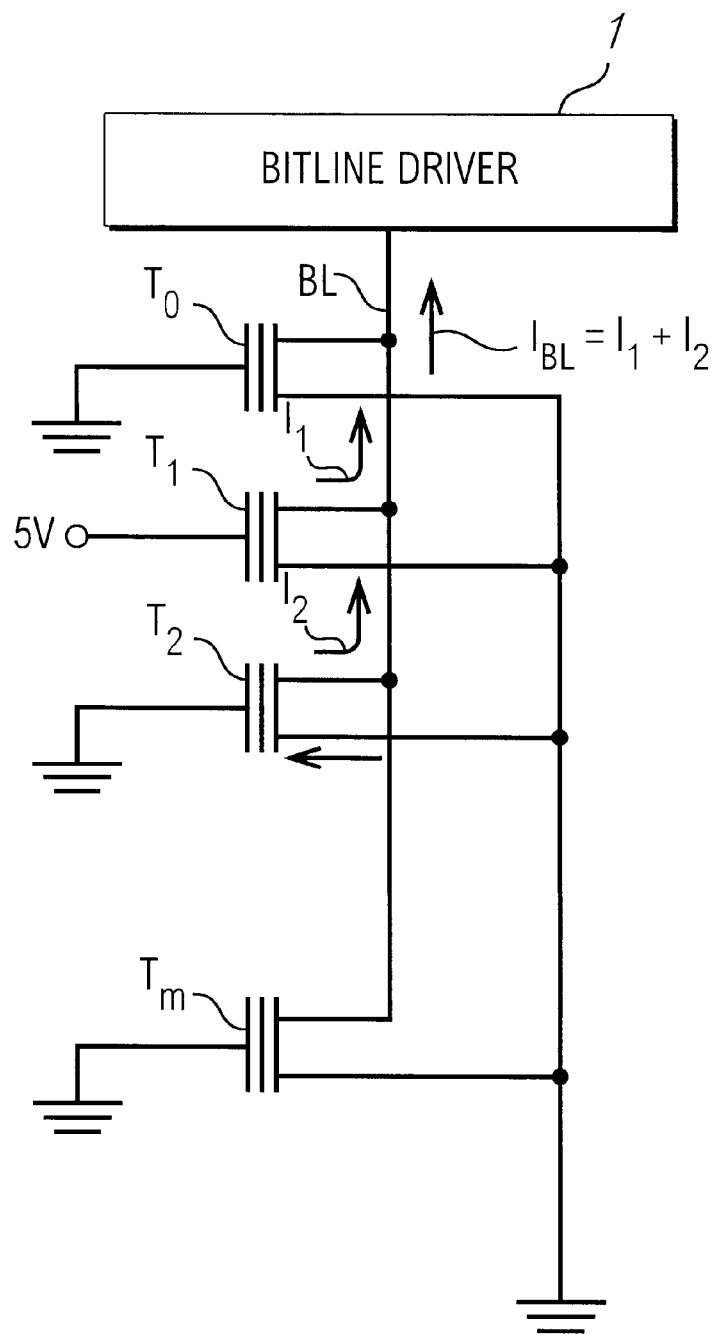
FIG. 1 is a simplified electrical schematic diagram showing how background leakage current is generated in a prior art flash Electrically Erasable Programmable Read-Only Memory (EEPROM)
Figure 2:
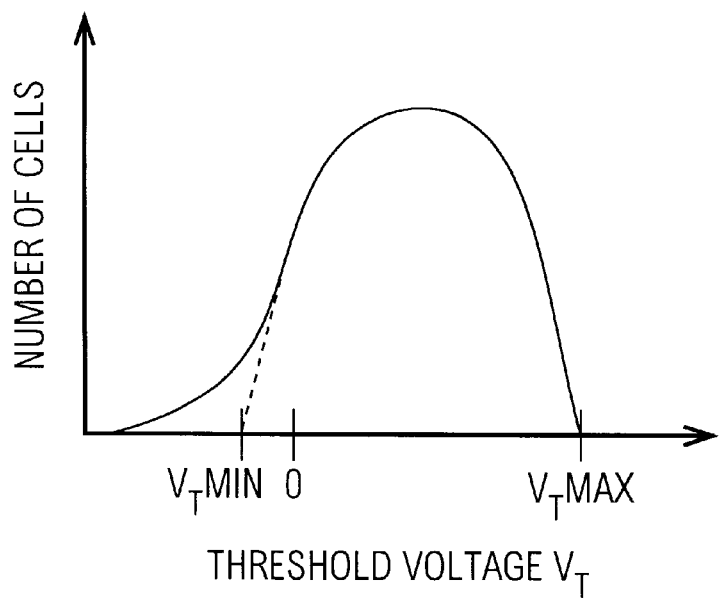
FIG. 2 is a graph illustrating a threshold voltage distribution in a flash EEPROM after an erase operation.
Figure 3:
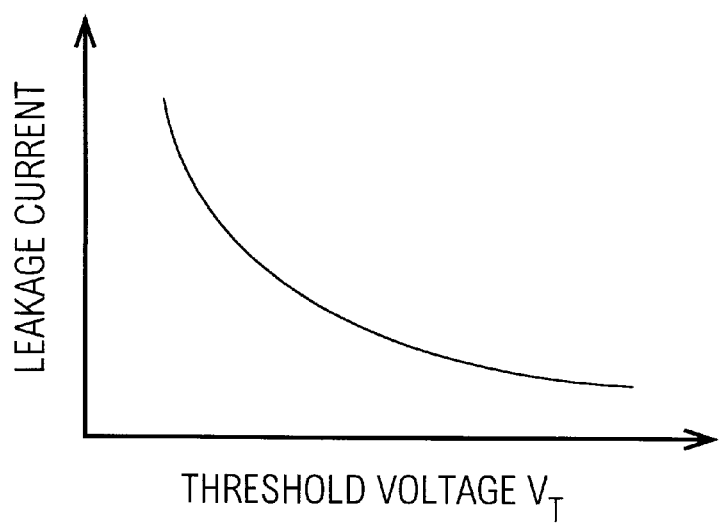
FIG. 3 is a graph illustrating how background leakage current varies as a function of threshold voltage for the least erased cells.

As yet another alternative within the scope of the invention, a complete erase operation including APD or APDE can be performed first. This will result in the threshold voltage distribution illustrated in FIG. 2 in which the threshold voltages of any cells which are below $V_T$MIN as illustrated in solid line are increased to at least $V_T$MIN as illustrated in broken line. The present overerase correction procedure is then performed such that the threshold voltages of all cells will be above $V_T$LOW as illustrated in broken line in FIG. 8.

The overerase correction procedure includes applying one or more overerase correction pulses to all of the cells of the memory, or alternatively to all of the cells in a bitline or sector (bank). The pulse or pulses are applied for a duration of time which is predetermined to achieve the desired result. The controller 15 controls the power source 13 for the duration of the overerase correction pulse(s) to apply a voltage to bitlines (drains of the cells) which is higher than the voltage applied to the wordlines (control gates) and to the sources of the cells.

The voltage applied to the bitlines is typically the conventional positive power supply voltage $V_{cc}$. A common value of $V_{cc}$ is 5 V, although the prevailing trend is toward lower values of $V_{cc}$ such as 3 V. In the latter case, as described above, an on-chip charge pump boosts the wordline voltage to approximately 4–5 V. Thus, the controller 15 controls the power source 13 to apply 4–5 V to all of the bitlines and thereby to the drains of all of the cells.

The voltage applied to the wordlines and thereby the control gates of the cells is selected to increase the threshold voltages of overerased cells, but prevent the threshold voltages of the least erased cells of the memory from being increased or disturbed by the overerase correction pulses. This tightens the threshold voltage distribution of the memory cells.

Assuming that the maximum allowable threshold voltage for an erased cell is $V_T$MAX=2 V, a control gate voltage $V_G$ is applied to the control gates of the cells for the duration of the overerase correction pulses. Typically, the voltage $V_G$ will be approximately equal to $V_T$MAX, but can be higher or lower in accordance with the constraints of a particular application as will be described below.

Since the control gate voltage must be higher than the threshold voltage for current to flow in an enhancement mode FET, no current flow will occur in cells having threshold voltages above $V_G$. Thus, the least erased cells will not be disturbed by the overerase correction pulses.

The present overerase correction procedure can be thought of as "soft" or "dumb" programming because it is an open loop operation with no attempt being made to determine the results. No feedback is required since the procedure is self-limiting in that no threshold voltages will be increased above the predetermined value of $V_T$LOW.

The control gate voltage $V_G$ is determined by two constraints:

1. The length of time required to increase the threshold voltages of undererased cells to $V_T$LOW.

2. Preventing the threshold voltages of the least erased cells from being increased or disturbed.

Figure 7:
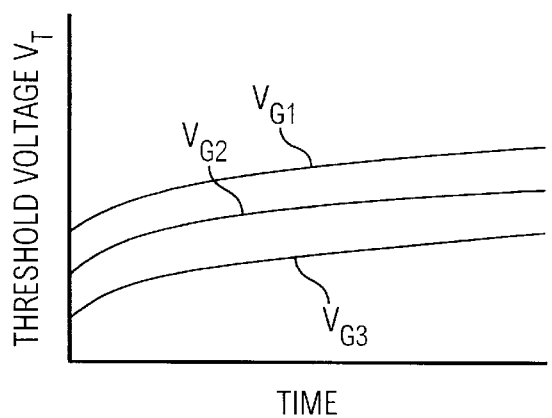
FIG. 7 is a graph illustrating how threshold voltage varies as a function of time and gate voltage in response to application of overerase correction pulses.

FIG. 7 illustrates how the threshold voltage of a cell increases as a function of time (duration and number of overerase correction pulses) and control gate voltage. A gate voltage $V_{G1}$ is higher than a gate voltage $V_{G2}$ which is in turn higher than a gate voltage $V_{G3}$. It will be seen that the threshold voltage increases to a higher level with a higher applied control gate voltage in a given length of time. However, if the control gate voltage is too high and/or the overerase correction pulse duration is too long, the overerase correction pulses can cause threshold voltages to be increased above $V_T$MAX, which is undesirable. Therefore, the voltages and pulse duration are balanced to produce the required results.

Figure 8:
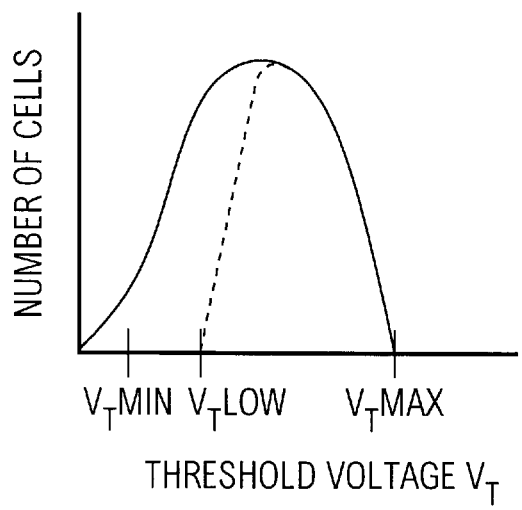
FIG. 8 is a graph illustrating how the threshold voltage distribution is tightened by a method of the present invention.

FIG. 8 illustrates the results of performing the present overerase correction method. The solid line curve is the same as in FIG. 2 and illustrates the initial threshold voltage distribution resulting from applying one or more erase pulses to the memory. A phantom line curve shows how the threshold voltages of cells which were initially below a voltage $V_T$LOW are increased to at least $V_T$LOW.

The right side of the phantom line curve coincides with the right side of the initial curve and is indistinguishable in the drawing. It will be seen in FIG. 8 that the present method eliminates overerased cells and reduces the threshold voltage distribution from below $V_T$MIN<$V_T$<$V_T$MAX to $V_T$LOW<$V_T$<$V_T$MAX.

The selected control gate voltage and pulse duration will cause the threshold voltages of cells having initial threshold voltages lower than $V_T$LOW to be increased to at least $V_T$LOW.

The sources of the cells can be grounded (or at the same voltage as the substrate). However, a source bias on the order of 0.5 V higher than the substrate voltage is preferably applied to the sources of the cells to turn off leakage current in accordance with the present invention.

In accordance with the "body effect", applying a source to substrate bias voltage has the effect of increasing the threshold voltage of a field effect transistor. The present inventors have discovered that applying a small source bias voltage to the cells of a flash EEPROM has the effect of substantially cutting off background leakage current during application of the present overerase correction pulses, or at least reducing the leakage current by a substantial amount. The threshold voltages of cells with source bias applied is higher than the threshold voltages during a read operation with no source bias applied.

Figure 9:
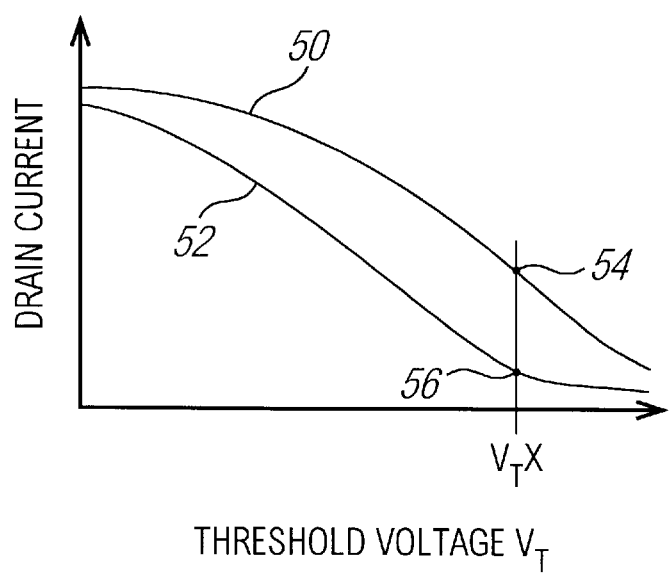
FIG. 9 is a graph illustrating how background leakage voltage is substantially eliminated in accordance with the invention.

FIG. 9 illustrates drain current as a function of the threshold voltage of a cell during application of an overerase correction pulse. A curve 50 shows the relationship without source bias whereas a curve 52 shows the relationship with source and gate bias. The vertical or Y-axis represents the drain current as measured for two different source and gate bias conditions. The curve 50 represents both source and gate voltages at 0 V, whereas the curve 52 represents both source and gate voltages at 0.5 V. For comparison, the threshold voltages for the two curves were measured without source bias.

The curve 52 is shifted leftwardly as viewed in the drawing due to the increase in threshold voltage caused by the source bias. As such, the drawing illustrates that for a given value of threshold voltage, the drain current and thereby the background leakage current are reduced or substantially eliminated by the application of source bias. For example, for a threshold voltage of $V_T$X, the drain current has a relatively high value without source bias as indicated at 54 and a negligibly low value with source bias as indicated at 56.

Reduction or elimination of background leakage current enables overerase correction to be performed with reduced current requirements, and further enables overerase correction to be performed without reduction from a speed which is possible without background leakage. The invention is especially advantageous in low power supply voltage $V_{cc}$ applications (e.g. $V_{cc}$=3 V or less) in which the background leakage current has heretofore prevented overerase correction from being applied in a reliable manner.

The present inventors have discovered that in the context of a flash EEPROM there is a particular value of source bias that will substantially shut off leakage current without reducing the programming speed (the speed at which the threshold voltage is increased toward $V_T$LOW) by the overerase correction pulses. The actual value of source bias depends on the parameters of a particular application, and can be determined empirically, by computer simulation or a combination thereof.

Figure 10:
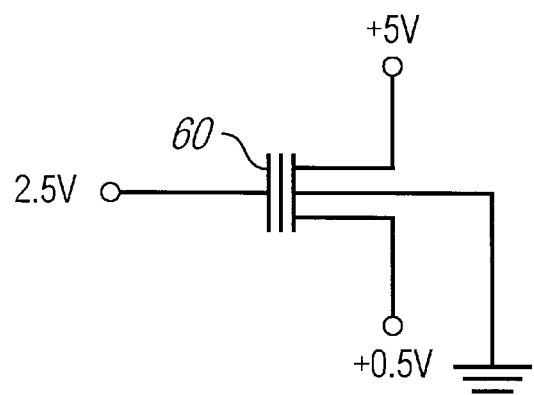
FIG. 10 is an electrical schematic diagram illustrating voltages applied to a memory cell during overerase correction in accordance with the invention.
Figure 11:
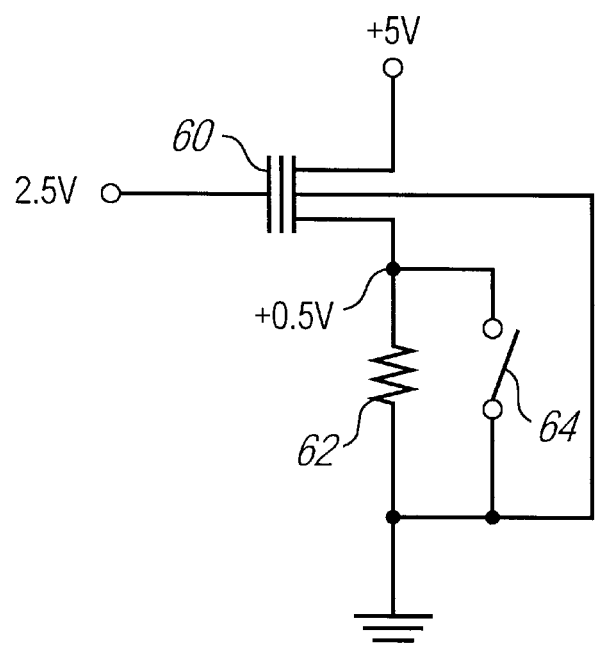
FIG. 11 is similar to FIG. 10 but illustrates an alternative arrangement.

The source bias can be applied in several ways in accordance with the invention. FIG. 10 illustrates how the required voltages can be directly applied to a memory cell 60 by the power source 13. FIG. 11 illustrates how the source bias can be alternatively generated by a resistor 62 which is connected between the source of the cell 60 and the substrate (ground). Current flow through the cell 60 and resistor 62 creates a voltage drop across the resistor 62 which appears at the source of the cell 60.

The value of the resistor 62 can be calculated using Ohm's Law as being equal to the desired source bias voltage divided by the drain current. When it is desired to connect the source directly to the substrate of the cell 60 the resistor 62 can be shorted out as symbolically indicated by a switch 64. It is within the scope of the invention to develop a source bias by connecting electrical resistance between the substrate and the common source connection of the cells. It is further within the scope of the invention to provide a separate resistor between the common source connection for each bitline and the substrate, or to provide a separate resistor between the source of each cell and the substrate.

A back bias voltage can also be applied to the source in the form of a negative voltage applied to the substrate or body. In an arrangement in which NMOS transistor cells, for example, are formed in P-type wells in a semiconductor substrate, a negative voltage can be applied to the P-wells. The source can be grounded, and −0.5 V applied to the substrate or P-well. This provides a higher horizontal electrical field for more effective soft programming.

In summary, the present invention overcomes the limitations of the prior art and tightens the threshold voltage distribution in a flash EEPROM after erase by increasing the threshold voltages of overerased cells while not affecting the threshold voltages of the least erased cells. In addition, leakage current in the cells is substantially eliminated, thereby reducing the power requirements and resulting in a further tightening of the threshold voltage distribution.

Various modifications will become possible for those skilled in the art after receiving the teachings of the present disclosure without departing from the scope thereof. For example, although the invention has been described as being applied to the memory 10 as illustrated in FIG. 4, it is also applicable to a memory such indicated at 16 in FIG. 5 which in which the cells are arranged in a plurality of banks.

In this case, the erase and overerase correction operations are performed independently and sequentially for the cell banks. As viewed in FIG. 5, the erase and overerase correction operations are first performed on the bank 18 with the bank select line $BS_1$ high and the select transistors $S_0$ to $S_n$ turned on, and then the erase and overerase correction operations are performed on the bank 20 with the bank select line $BS_2$ high and the select transistors $S_0'$ to $S_n'$ turned on. The bank 20 is turned off (bank select line $BS_2$ low) while the bank 18 is being accessed and the bank 18 is turned off (bank select line $BS_1$ low) while the bank 20 is being accessed.

Alternatively, the memory in FIG. 5 can be erased, programmed, and erase corrected in parallel, both banks being pulsed at the same time. In this case, pulses are applied to corresponding cells or sets of cells in the banks in parallel.

We claim:

1. A method for erasing a flash Electrically-Erasable Programmable Read-Only Memory (EEPROM) which includes a plurality of field effect transistor memory cells each having a source, drain, floating gate and control gate, comprising the steps of:
   (a) applying at least one erase pulse to a plurality of the cells; and
   (b) applying at least one overerase correction pulse to said plurality of the cells during which source, drain and control gate voltages of the cells are such that threshold voltages of overerased cells will be increased, but threshold voltages of least erased cells will not be increased.

2. A method as in claim 1, in which the control gate voltage is approximately equal to a threshold voltage of a least erased cell.

3. A method as in claim 1, in which:
   the cells are arranged in a plurality of sectors; and
   the method comprises performing steps (a) and (b) on the sectors sequentially.

4. A method as in claim 1, in which:
   the memory further comprises a substrate; and
   step (b) further comprises applying a voltage to the substrate which is lower than the source voltage and reduces leakage current in the cells.

5. A method as in claim 4, in which step (b) comprises grounding the substrate and applying a positive voltage to the source.

6. A method as in claim 4, in which step (b) comprises grounding the source and applying a negative voltage to the substrate.

7. A method as in claim 4, in which step (b) comprises connecting electrical resistance between the sources of the cells and the substrate.

8. A method as in claim 4, in which:
   the cells are arranged in a plurality of sectors; and
   the method comprises performing steps (a) and (b) on the sectors sequentially.

9. A method as in claim 1, in which the control gate voltage is higher than the source voltage and the drain voltage is higher than the control gate voltage in step (b).

10. A method as in claim 9, in which:
    the memory further comprises a substrate; and
    step (b) further comprises applying a voltage to the substrate which is lower than the source voltage and reduces leakage current in the cells.

11. A method as in claim 1, in which:
    step (a) comprises performing a complete erase and Automatic Program Disturb (APD) procedure to said plurality of the cells; and
    step (b) is performed after completion of step (a).

12. A flash Electrically-Erasable Programmable Read-Only Memory (EEPROM), comprising:
    a plurality of field effect transistor memory cells each having a source, drain, floating gate and control gate;
    a power source for supplying a plurality of voltages; and
    a controller for controlling the power source to apply at least one erase pulse to a plurality of the cells; and subsequently to apply at least one overerase correction pulse to said plurality of the cells during which source, drain and control gate voltages of the cells are such that threshold voltages of overerased cells will be increased, but threshold voltages of least erased cells will not be increased.

13. A memory as in claim 11, in which the controller controls the power source to apply a voltage to the control gates of the cells which is approximately equal to a threshold voltage of a least erased cell.

14. A memory as in claim 12, in which:
    the cells are arranged in a plurality of sectors; and
    the controller controls the power source to apply the erase and overerase correction pulses to the sectors sequentially.

15. A memory as in claim 12, in which:
    the memory further comprises a substrate; and
    the controller controls the power source to apply a voltage to the substrate for the duration of said at least one overerase correction pulse which is lower than the source voltage and reduces leakage current in the cells.

16. A memory as in claim 15, in which the controller controls the power source to ground the substrate and apply a positive voltage to the source.

17. A memory as in claim 15, in which the controller controls the power source to ground the source and apply a negative voltage to the substrate.

18. A memory as in claim 15, in which controller causes an electrical resistance to be connected between the sources of the cells and the substrate for the duration of said at least one overerase correction pulse.

19. A memory as in claim 15, in which:
    the cells are arranged in a plurality of sectors; and
    the controller controls the power source to apply the erase and overerase correction pulses to the sectors sequentially.

20. A memory as in claim 12, in which the control gate voltage is higher than the source voltage and the drain voltage is higher than the control gate voltage.

21. A memory as in claim 20, in which:
    the memory further comprises a substrate; and
    the controller controls the power source to apply a voltage to the substrate for the duration of said at least one overerase correction pulse which is lower than the source voltage and reduces leakage current in the cells.

22. A memory as in claim 12, in which the controller controls the power source to perform a complete erase and Automatic Program Disturb (APD) procedure to said plurality of the cells, and subsequently to apply said at least one overerase correction pulse to said plurality of the cells.

* * * * *